United States Patent
Yam

(10) Patent No.: US 11,302,689 B1
(45) Date of Patent: Apr. 12, 2022

(54) TRANSISTOR-INJECTED SILICON-CONTROLLED RECTIFIER (SCR) WITH PERPENDICULAR TRIGGER AND DISCHARGE PATHS

(71) Applicant: Hong Kong Applied Science and Technology Research Institute Company, Limited, Hong Kong (HK)

(72) Inventor: Chun-Kit Yam, Hong Kong (HK)

(73) Assignee: Hong Kong Applied Science and Technology Research Institute Company Limited, Hong Kong (HK)

(*) Notice: Subject to any disclaimer, the term of this patent is extended or adjusted under 35 U.S.C. 154(b) by 0 days.

(21) Appl. No.: 17/147,601

(22) Filed: Jan. 13, 2021

(51) Int. Cl.
  *H01L 27/02* (2006.01)
  *H01L 29/78* (2006.01)

(52) U.S. Cl.
  CPC ...... *H01L 27/0274* (2013.01); *H01L 27/0262* (2013.01); *H01L 29/785* (2013.01)

(58) Field of Classification Search
  CPC ............. H01L 27/0274; H01L 27/0262; H01L 29/785; H01L 27/0255
  See application file for complete search history.

(56) References Cited

U.S. PATENT DOCUMENTS

| | | | |
|---|---|---|---|
| 5,742,085 A | 4/1998 | Yu | |
| 5,905,288 A | 5/1999 | Ker | |
| 6,465,848 B2 | 10/2002 | Ker et al. | |
| 6,580,184 B2 | 6/2003 | Song | |
| 6,759,691 B2 | 7/2004 | Chen | |
| 6,876,041 B2 | 4/2005 | Lee et al. | |
| 8,455,949 B2 * | 6/2013 | Gossner | .................. H01L 23/60 257/355 |
| 8,686,510 B2 * | 4/2014 | Gossner | .............. H01L 27/0262 257/355 |

(Continued)

FOREIGN PATENT DOCUMENTS

| | | |
|---|---|---|
| CN | 105556667 A | 5/2016 |
| CN | 109300891 A | 2/2019 |

(Continued)

OTHER PUBLICATIONS

ISR and Written Opinion, PCT/CN2021/072270, dated Sep. 28, 2021.

*Primary Examiner* — Changhyun Yi
(74) *Attorney, Agent, or Firm* — gPatent LLC; Stuart T. Auvinen

(57) ABSTRACT

An Electro-Static-Discharge (ESD) protection circuit has a Silicon-Controlled Rectifier (SCR) with a discharge current path in a first direction. A triggering transistor has a trigger current flowing in a second direction that is perpendicular to the first direction. Triggering transistors can be Fin Field-Effect Transistor (FinFET) transistors with current flowing along the long direction of the fins. The trigger current flows into a connecting N+ drain and into an N-Well under a center portion of the connecting N+ drain to inject carriers into the N-base of a PNPN SCR. The injected current flows through the base to generate a voltage gradient that turns on the PN junction in a P+ emitter that is parallel to but spaced apart from the FinFET transistors, causing a discharge current to flow perpendicular to the fins. The perpendicular discharge current flows through the substrate which can handle a larger current than the small fins.

20 Claims, 15 Drawing Sheets

(56) References Cited

U.S. PATENT DOCUMENTS

| | | |
|---|---|---|
| 9,318,479 B2 | 4/2016 | Li et al. |
| 9,595,519 B2 | 3/2017 | Titus et al. |
| 9,640,523 B2 | 5/2017 | Cai et al. |
| 2004/0164354 A1 | 8/2004 | Mergens et al. |
| 2013/0240992 A1* | 9/2013 | Gossner .................. H01L 23/60 |
| | | 257/347 |

FOREIGN PATENT DOCUMENTS

| | | |
|---|---|---|
| KR | 20020015199 A | 2/2002 |
| KR | 20060042763 A | 5/2006 |
| KR | 20070003076 A | 1/2007 |
| TW | 501263 B | 9/2002 |

\* cited by examiner

CROSS-SECTION 110

US 11,302,689 B1

TRANSISTOR-INJECTED SILICON-CONTROLLED RECTIFIER (SCR) WITH PERPENDICULAR TRIGGER AND DISCHARGE PATHS

FIELD OF THE INVENTION

This invention relates to Electro-Static-Discharge (ESD) protection circuits, and more particularly to ESD protections circuits with perpendicular trigger and discharge devices in Fin Field-Effect Transistor (FinFET) processes.

BACKGROUND OF THE INVENTION

Integrated circuits (IC's) are prone to damage caused by an electro-static-discharge (ESD) pulse. Various ESD-protection structures have been placed near input, output, or bi-directional I/O pins of ICs. Many of these protection structures use passive components such as series resistors, diodes, and thick-oxide transistors. Other ESD structures use an active transistor to safely shunt ESD current.

As manufacturing ability improves and device sizes shrink, lower voltages are applied to transistors during normal operation. These smaller transistors are much more susceptible to over-voltage failure but can operate with a lower power-supply voltage, thus consuming less power and producing less heat.

Such smaller transistors are often placed in an internal "core" of an IC, while larger transistors with gate lengths that are above the minimum are placed around the core in the periphery. ESD-protection structures are placed in the periphery using these larger transistors.

Thinner gate oxides of the core transistors can be shorted, and substrate junctions melted, by relatively small capacitively-coupled currents applied to the tiny core devices. Static charges from a person or machinery can produce such damaging currents that are only partially blocked by the input-protection circuits in the periphery.

FIG. 1 shows a chip with several ESD-protection clamps. Core circuitry 23 contains core transistors 22, 24, which have a small channel length and can be damaged by currents at relatively low voltages. Core circuitry 23 receives a power supply voltage VDD, such as 1.8 volts, 1.2 volts, or some other value. There may be thousands of core transistors in core circuitry 23.

Protection from ESD pulses may be provided on each I/O pad, and by power clamp 26. Power clamp 26 is coupled between VDD and ground (VSS), and shunts current from an ESD pulse between the power rails.

Each I/O pad 10 may be outfitted with one or more ESD protection devices 12, 16 to protect against various possibilities. ESD protection device 16 turns on for a positive ESD pulse applied from ground to I/O pad 10, while ESD protection device 18 turns on for a positive ESD pulse applied from ground to I/O pad 11. Likewise, ESD protection device 12 turns on for a positive ESD pulse applied from I/O pad 10 to VDD while ESD protection device 14 turns on for a positive ESD pulse applied from I/O pad 11 to VDD. Power clamp 26 may also turn on in some situations.

More recently, planar MOSFET devices are being replaced by FinFET. FinFET uses a more three-dimensional transistor structure where the transistor gate is no longer within one single plane. FinFET uses a smaller area and tend to have smaller leakages than traditional planar transistors.

FIG. 2 shows a prior-art FinFET device. N+ regions 42, 44 are formed on substrate 20 and are surrounded by oxide 62. Substrate 20 can be a silicon substrate or an insulator for Silicon-On-Insulator (SOI) processes. N+ regions 42, 44 are very thin, having a slim, fin-like appearance. Between N+ region 42 and N+ region 44 is a connecting region of lightly-p-doped silicon that acts as the transistor channel. N+ region 42, the channel connecting region, and N+ region 44 can all be formed on the same fin of silicon.

Gate 52 is formed around the channel connecting region. Rather than being flat, gate 52 has an inverted U-shape that surrounds the channel connecting region between N+ regions 42, 44. Gate oxide 60 is formed on three sides of the fin-like channel connecting region rather than only on the top surface of the channel region.

FinFET transistors may have better current drive than equivalent flat transistors for the same die area due to this 3-D gate and channel structure. However, when a FinFET transistor is used for ESD protection, the high ESD currents can damage the FinFET transistor. In particular, extreme heating is sometimes seen in N+ region 42 near the junction to the channel region under gate 52. This extreme heating when a large ESD current passes through N+ region 42 can permanently damage gate oxide 60 and N+ region 42, causing the device to leak or malfunction.

Also, the thin or slim size of the fin used for N+ region 42 causes the current to be crowded into a narrow region, causing localized hot spots. Heat dissipation is hindered by the slim fin of N+ region 42 that is typically surrounded by an insulator including oxide 62 and a passivation insulator that covers everything, including N+ region 42, oxide 62, and gate 52. Oxides and other insulators are often poor heat conductors.

When FinFET devices are used in ESD structures, the device turn-on resistance and the routing resistance are high compared with ESD structures constructed with planar transistors.

What is desired is an ESD-protection circuit that has lower parasitic resistances even when using FinFET devices. An ESD input-protection circuit that carries a high current but still has a low resistance is desired. An ESD circuit that can be used with both a traditional planar process and a FinFET process is desired.

DETAILED DESCRIPTION

Figure 1:
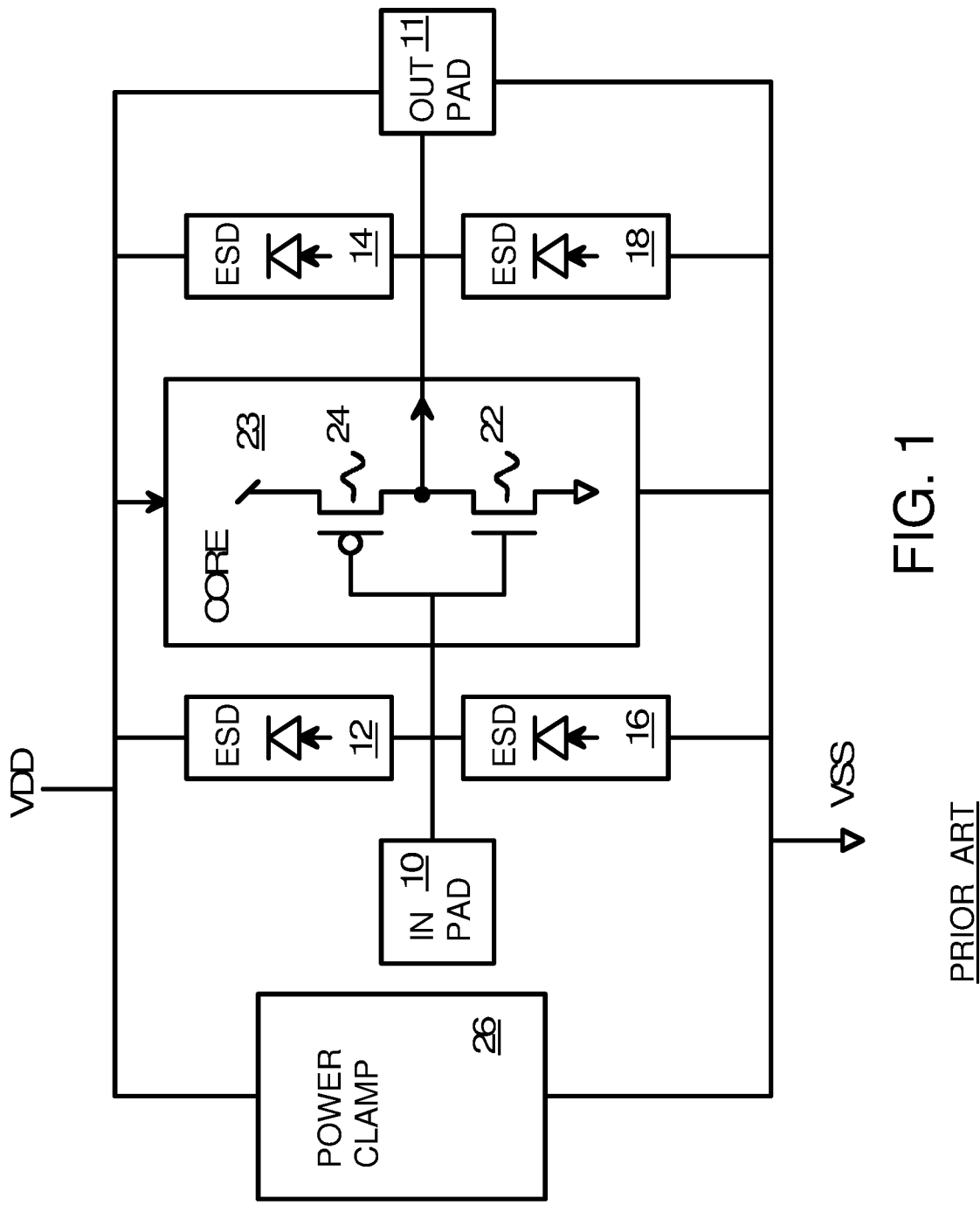
FIG. 1 shows a chip with several ESD-protection clamps.
Figure 2:
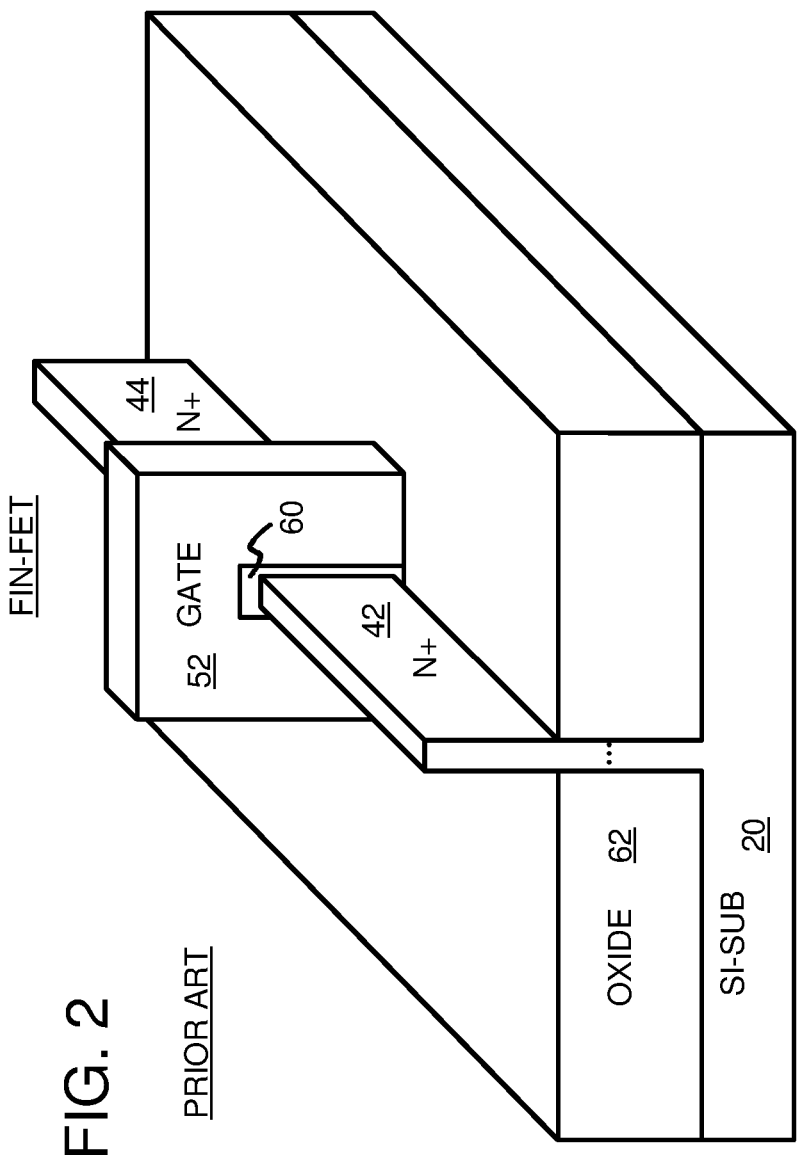
FIG. 2 shows a prior-art FinFET device.

The present invention relates to an improvement in ESD-protection structures. The following description is presented to enable one of ordinary skill in the art to make and use the invention as provided in the context of a particular application and its requirements. Various modifications to the preferred embodiment will be apparent to those with skill in the art, and the general principles defined herein may be applied to other embodiments. Therefore, the present invention is not intended to be limited to the particular embodiments shown and described, but is to be accorded the widest scope consistent with the principles and novel features herein disclosed.

The inventor has realized that FinFET devices are ideal for use as triggering devices in an ESD structure, but are poor choices for discharge devices. The large ESD currents that flow through discharge devices can quickly heat up and damage the small FinFET devices that have channels within the tiny FinFET fins. However, FinFET devices turn on very quickly because of their small channels within their fins, so FinFET transistors are ideal for triggering devices.

The inventor further realizes that FinFET processes tend to form all fins in a same direction. For example, a FinFET process may align all fins in a horizontal direction and no fins in the vertical direction. The FinFET process itself may require the fins to be aligned and parallel due to various processing steps that are able to form the fins in only one direction.

An ESD structure may use a Silicon-Controlled Rectifier (SCR) The SCR may have a triggering device such as a MOSFET transistor, and a discharge device such as NPN or PNP bipolar transistors that are part of the PNPN or NPNP structure of the SCR. These bipolar transistors can be formed in the substrate diffusions and wells.

The inventor further realizes that FinFET devices that are aligned in a horizontal direction can be used for triggering the SCR, while discharge devices in the substrate can be formed in a vertical direction. Triggering currents can flow through the fins in the horizontal direction, while larger discharge currents can flow through the substrate in a vertical direction. Discharge currents flow perpendicular to triggering current flow in the fins, and thus the discharge currents do not overheat the FinFET fins since the discharge currents flow perpendicular to the fins. Thus the FinFET fins are protected from damage by the large discharge currents.

The ESD device can be tuned for a fast trigger by adjusting the properties or geometry of the horizontal FinFET devices, while the ESD discharge current can be separately adjusted by adjusting the size and geometry of the vertical current paths through the substrate. A low turn-on resistance for the discharge current can be provides by large structures in the substrate, without harming the delicate FinFET transistors used for triggering. Trigger and discharge can be separately optimized since their current paths are perpendicular.

Figure 3:
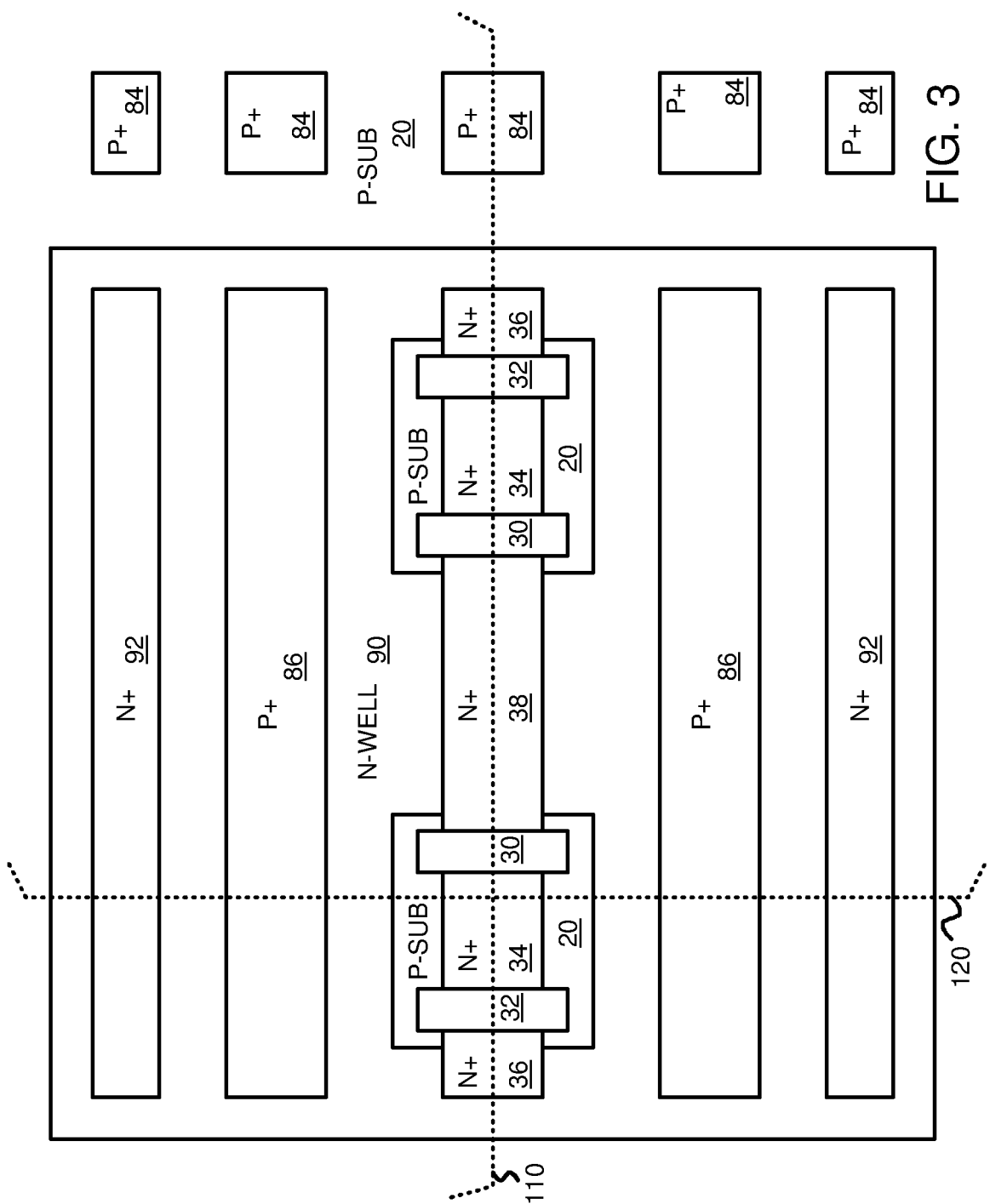
FIG. 3 shows a planar-process ESD SCR structure with perpendicular trigger and discharge paths.

FIG. 3 shows a planar-process ESD SCR structure with perpendicular trigger and discharge paths. The device can be realized in both FinFET and planar processes. The device in the simpler planner process is described first.

Gates 30, 32 can be polysilicon, forming MOS transistors between source N+ sources 34 and N+ drains 36, 38. Connecting N+ drain 38 connects to both gates 30, while end N+ drains 36 each connect to only a single gate 32. Openings in N-Well 90 form islands of p-substrate 20 that surround and are underneath the transistors formed where gates 30, 32 intersect between N+ sources 34 and N+ drains 36, 38.

The current flow through these triggering transistors formed by gates 30, 32 is in a horizontal direction, along or parallel to horizontal cross-section 110. The central area of connecting N+ drain 38 that is outside of the islands of p-substrate 20 and over N-Well 90 act as a tap to N-Well 90 to inject the triggering current into N-Well 90.

P+ emitter 86 is formed in N-Well 90 at some distance above and below the central triggering transistors along horizontal cross-section 110 so that P+ emitter 86 does not intersect horizontal cross-section 110. N+ tap 92 is formed to bias N-Well 90, further out from P+ emitter 86. P+ taps 84 are formed outside of N-Well 90 to bias p-substrate 20. The islands of p-substrate 20 with transistor gates 30, 32 are electrically connected to areas of p-substrate 20 with P+ taps 84 since p-substrate 20 extends underneath the shallower N-Well 90.

A PNPN SCR structure is formed by P+ emitter 86, N-Well 90, p-substrate 20, and N+ sources 34. This is a vertical structure since current flows in a predominantly vertical direction along or parallel to vertical cross-section 120. A large discharge current can flow in the vertical direction parallel to vertical cross-section 120, since the diffusion areas in the substrate are large. A smaller triggering current flows horizontally parallel to horizontal cross-section 110 through the transistors.

Figure 4:
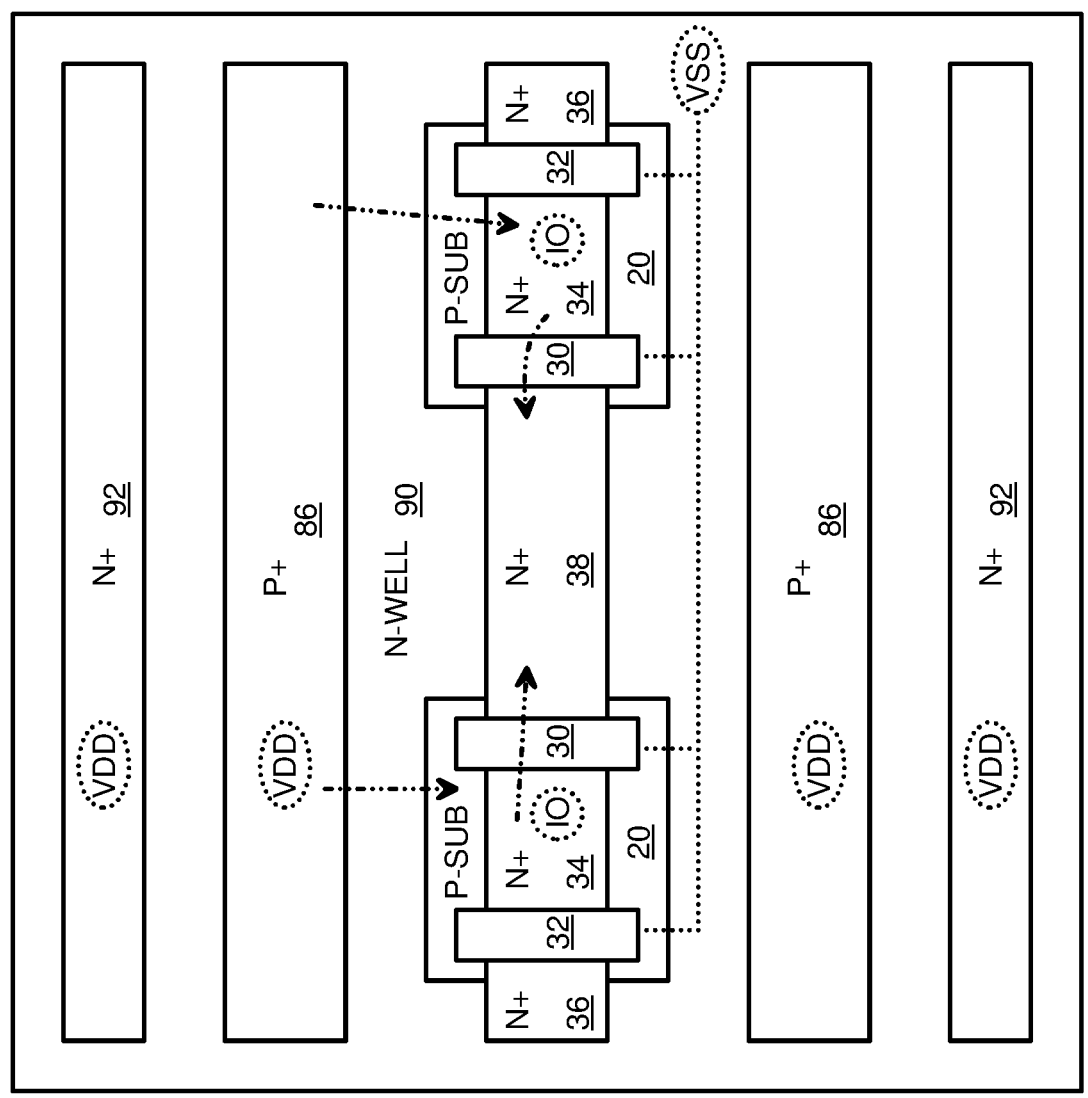
FIG. 4 highlights horizontal and vertical current flow in the ESD SCR structure.

FIG. 4 highlights horizontal and vertical current flow in the ESD SCR structure. The IO pad is connected to N+ sources 34 between gates 30, 32. When an ESD pulse is applied to the IO pad, N+ sources 34 quickly rise in voltage and turn on the transistor, allowing a triggering current to flow under gate 30 from N+ sources 34 to connecting N+ drain 38. Gates 30, 32 can be grounded. Power or VDD can be applied to 92 to bias N-Well 90, and to P+ emitter 86. The current that flows through gates 30 to connecting N+ drain 38 can flow through N-Well 90 to N+ tap 92 and to VDD.

As this current flows through the relatively high resistance of N-Well 90, a voltage gradient or voltage drop forms. Once this voltage gradient exceeds the pn junction diode voltage of about 0.5 volts, the PN junction from P+ emitter 86 to N-Well 90 can turn on, injecting positive charge (holes) back into N-Well 90 that is collected by p-substrate 20 and flows to the IO pad through N+ sources 34. The holes collected by p-substrate 20 pull up the regional potential of p-substrate 20, which is the base region of a NPN Bipolar Junction Transistor (BJT) of N-Well 90, p-substrate 20, and N+ source 34. This higher potential of p-substrate 20 triggers the turn-on of the NPN BJT, which further pulls down the potential of N-Well 90. The SCR becomes self-sustaining as the NPN and PNP structures turn on.

Figure 5:
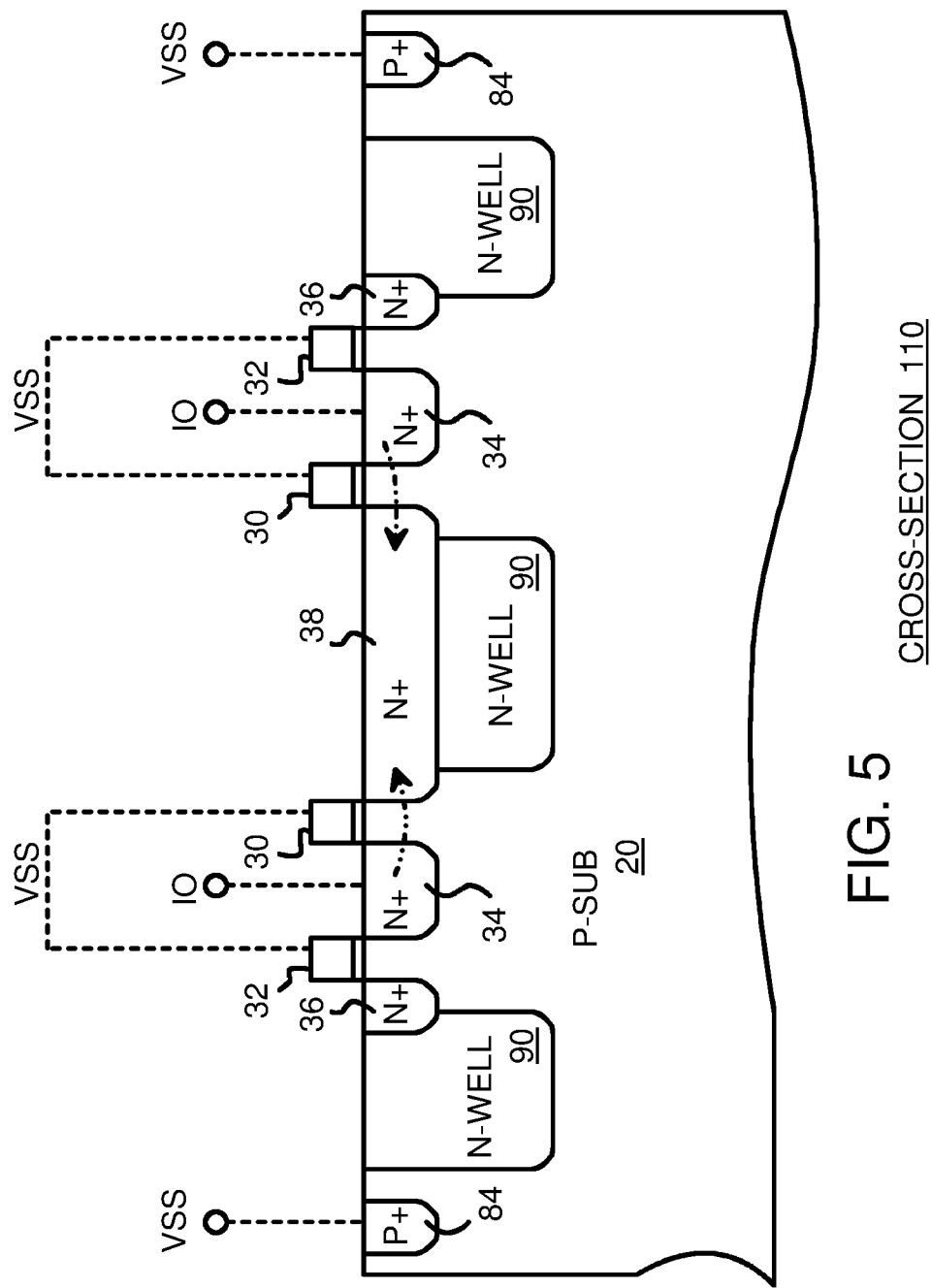
FIG. 5 is a horizontal cross-section along the triggering transistors.

FIG. 5 is a horizontal cross-section along the triggering transistors. Horizontal cross-section 110 (FIG. 3) include transistors where gates 30, 32 have a gate oxide above p-substrate 20. Gates 30 form transistors between N+ sources 34, connected to the IO pad, and connecting N+ drain 38, that has a central region that connects to N-Well 90. Gates 32 form transistors between N+ sources 34 and end N+ drains 36. End drains 36 and connecting N+ drain 38 form symmetric transistor structures with gates 32, 30. End N+ drains 36 may also connect to N-Well 90, depending on the process alignment, so that trigger current may also flow under gate 32 and into N-Well 90 for enhanced triggering. P+ taps 84 bias p-substrate 20 to VSS (ground). The islands of p-substrate 20 under gates 30, 32 are electrically biased by P+ taps 84 since p-substrate 20 is deeper than N-Well 90. Gates 30, 32 can also be connected to VSS.

Figure 6:
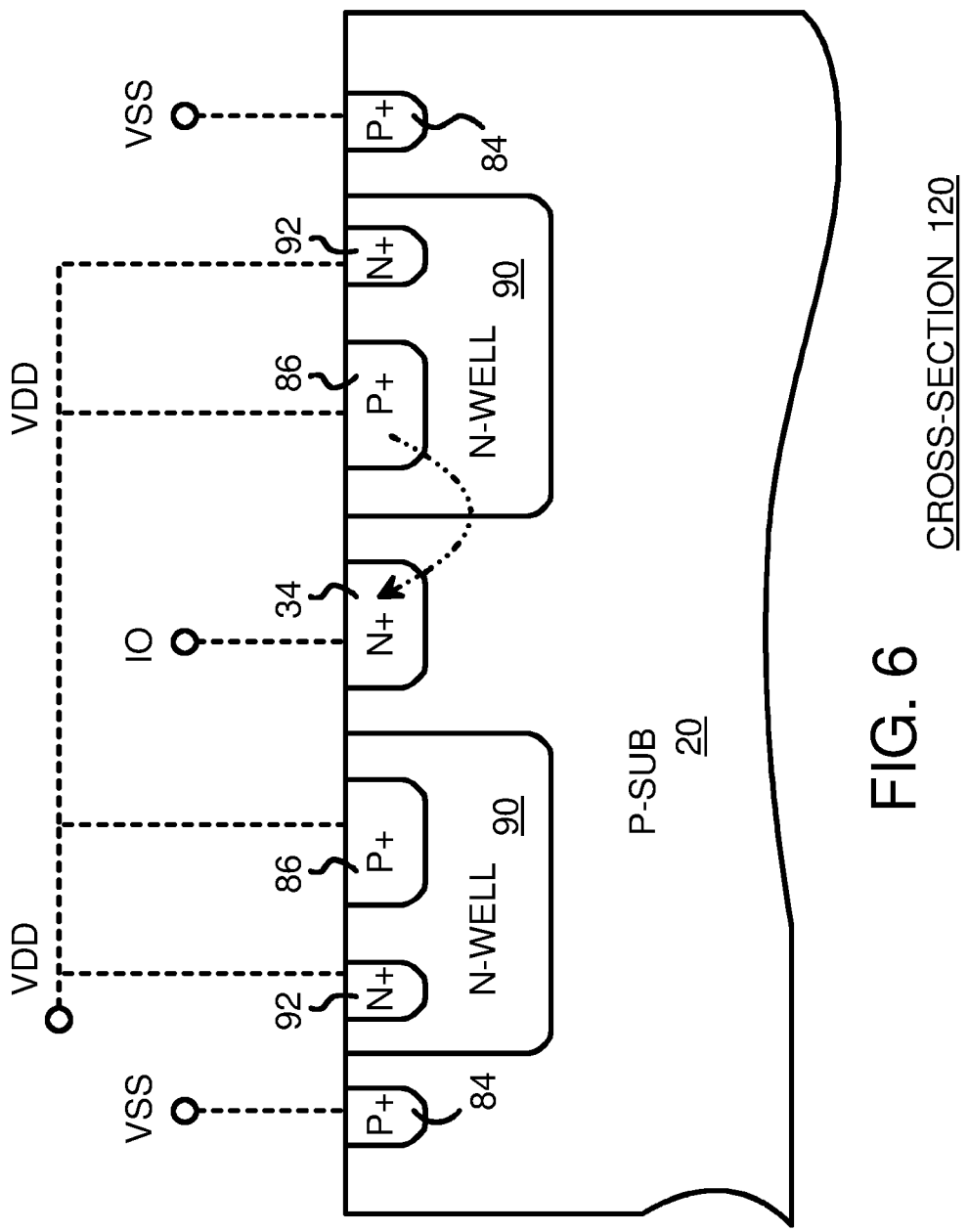
FIG. 6 is a vertical cross-section along the discharge current path.

FIG. 6 is a vertical cross-section along the discharge current path. Vertical cross-section 120 is perpendicular to horizontal cross-section 110, which crosses through N+ source 34 and the triggering devices (not shown) in the center, as a tangent to the plane of FIG. 6.

The center island of p-substrate 20 surrounds N+ source 34, which is connected to the IO pad. N-Well 90 is formed on both sides of this central island and include P+ emitter 86 and N+ tap 92 that are both connected to VDD. P+ taps 84 bias p-substrate 20.

After triggering, the SCR conducts a discharge current that flows from VDD, P+ emitter 86, N-Well 90, p-substrate 20, to N+ source 34, a PNPN structure. The relatively large diffusion structures of N+ sources 34, P+ emitter 86, and N-Well 90 can carry a large discharge current.

Figure 7:
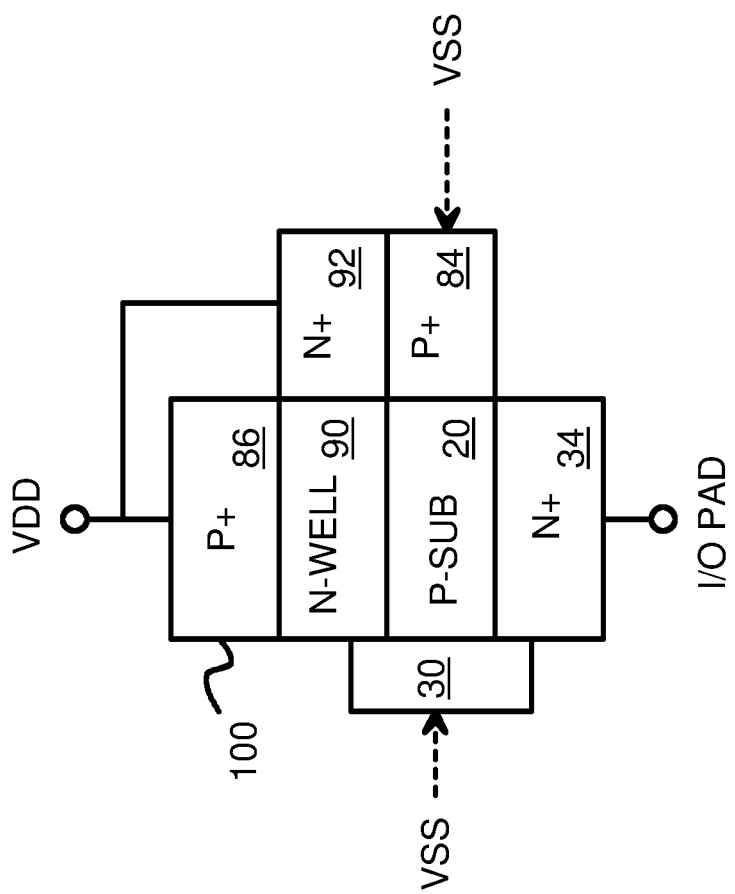
FIG. 7 is a diagram of the PNPN structure in the SCR.

FIG. 7 is a diagram of the PNPN structure in the SCR. SCR 100 has P+ emitter 86 connected to VDD, N-Well 90, p-substrate 20, and N+ sources 34 that connect to the IO pad, forming the PNPN SCR structure. P-substrate 20 is biased to VSS by P+ taps 84, while N-Well 90 is biased to VDD by N+ taps 92. However, the large resistivities of p-substrate 20 and N-Well 90 allow for voltage gradient to develop when triggering currents flow, allowing pn junction to turn on.

Gate 30 forms a triggering transistor that allows current to flow through a channel in p-substrate 20, from N+ sources 34, through the channel to connecting N+ drain 38 (not shown), which connects to N-Well 90. Thus gate 30 causes a triggering current to be injected into N-Well 90. This injected triggering current causes a voltage gradient across N-Well 90, allowing the pn junction to turn on, triggering the SCR operation and the discharge current to flow.

Figure 8:
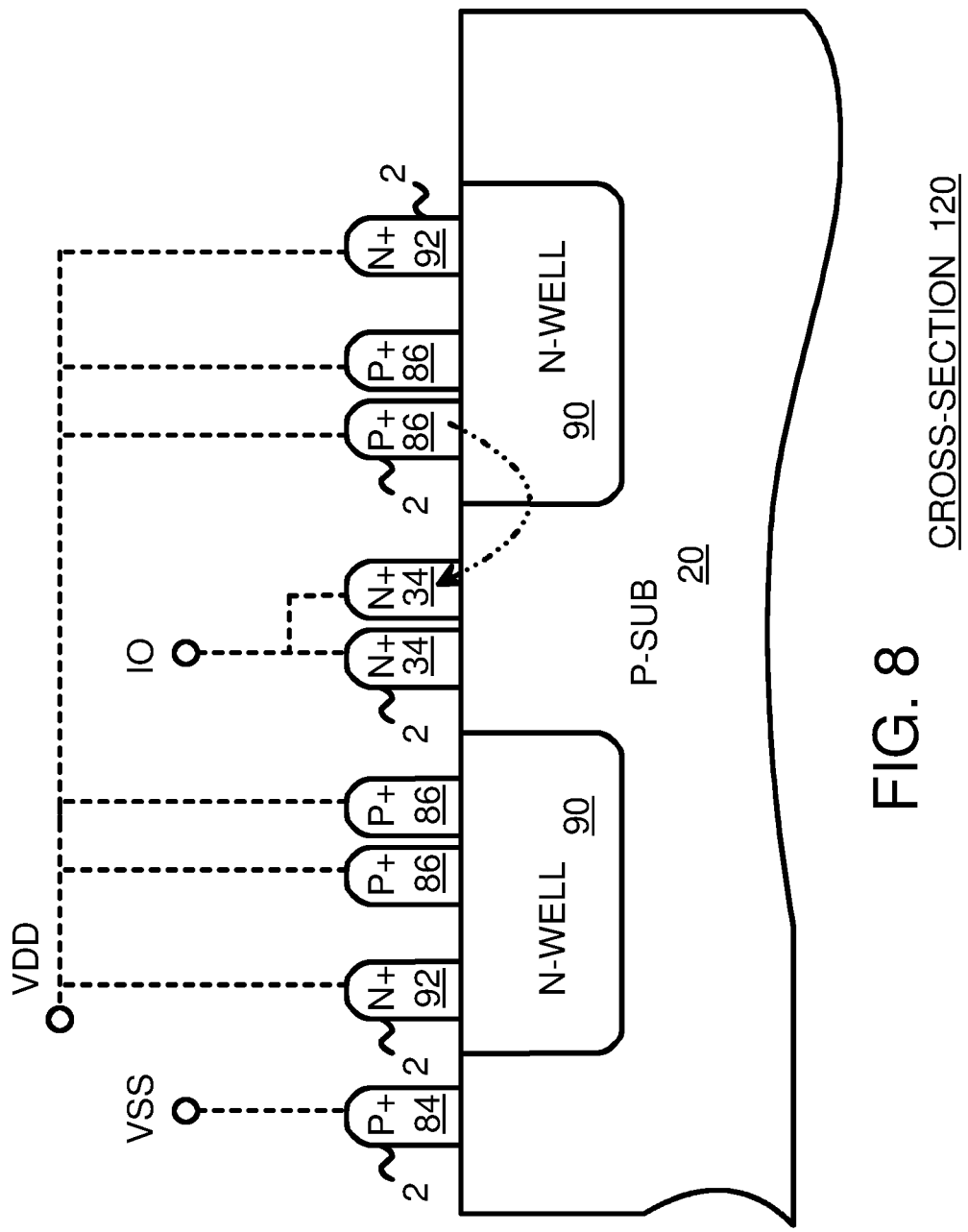
FIG. 8 is a vertical cross-section for a FinFET process.

FIG. 8 is a vertical cross-section for a FinFET process. Fins 2 are formed above the surface of the substrate that includes p-substrate 20 and N-Well 90. N+ and P+ diffusion regions are formed in fins 2 above the substrate, while N-Well 90 and p-substrate 20 are formed in the substrate.

Fins 2 extend above and below the plane of FIG. 8. Only a small cross-section of fins 2 is shown in FIG. 8. Vertical cross-section 120 is perpendicular to the long direction of the fins and cuts through the fins as a cross-section.

N+ sources 34 are formed in fins 2 near the center and connect to the IO pad. P+ emitter 86 and N+ tap 92 are formed in other fins 2 over N-Well 90 and are connected to VDD. P+ taps 84 are formed in still other fins 2 above p-substrate 20 and connect to VSS.

Figure 9:
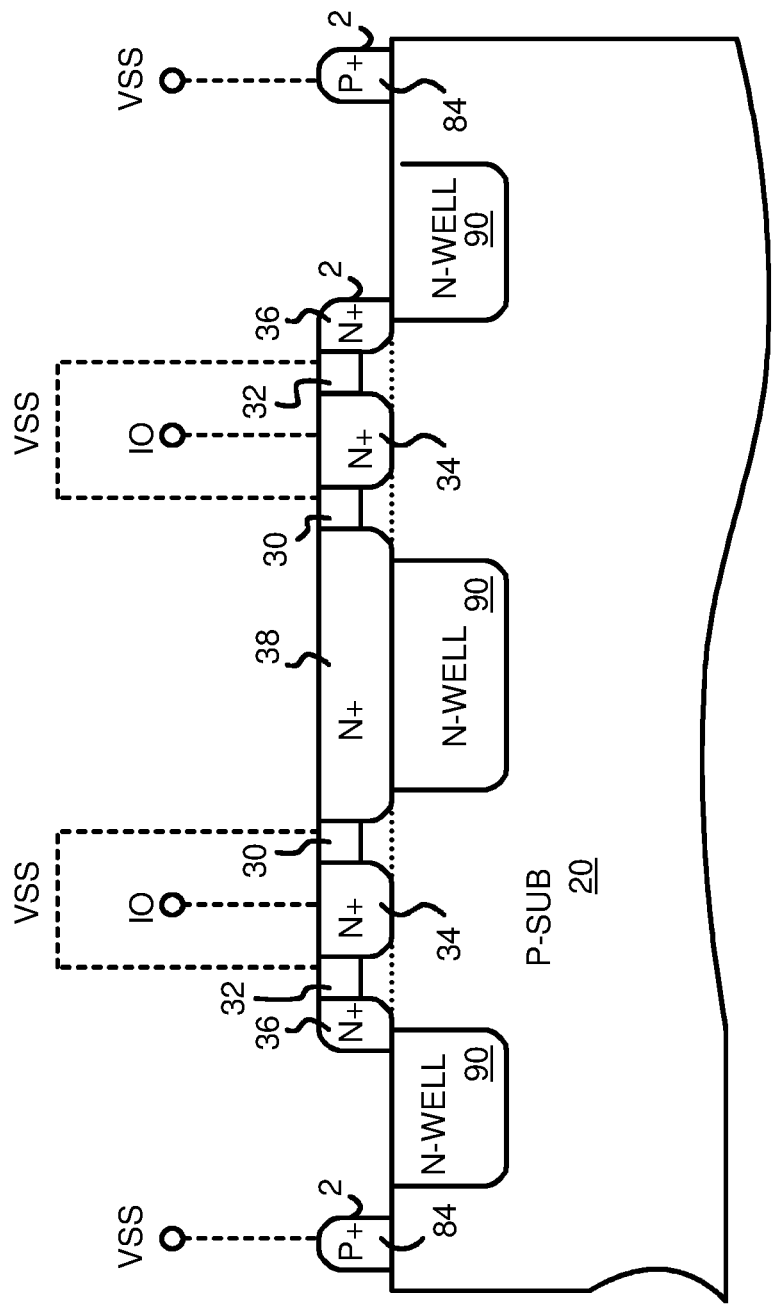
FIG. 9 is a horizontal cross-section through the FinFET triggering transistors.

FIG. 9 is a horizontal cross-section through the FinFET triggering transistors. Horizontal cross-section 110 is parallel with the long direction of the fins. In FIG. 9, horizontal cross-section 110 cuts through one long fin and two isolated portions of the fin. During processing, fins 2 could all have been the same fin that later had portions cut or etched to form 3 sections of the fin. End fins 2 are implanted with P+ dopant to form P+ taps 84 that bias p-substrate 20 to VSS. Central fin 2 has four gates 30, 32 that can be polysilicon that wraps around the top and upper sides of the fin. Gates 30, 32 are connected to VSS.

N+ sources 34 are formed between gates 30, 32 in fin 2, and are connected to the IO pad. End N+ drains 36 are formed at the end of central fin 2, adjacent to gates 32. Connecting N+ drain 38 is formed on central fin 2 between gates 30. A central portion of connecting N+ drain 38 has N-Well 90 underneath, while end portion of connecting N+ drain 38 have p-substrate 20 underneath.

The trigger current flows along the long direction of central fin 2, from N+ sources 34 under gates 30 to connecting N+ drain 38, and from N+ sources 34 under gates 32 to end N+ drains 36. End N+ drains 36 touch N-Well 90.

Figure 10:
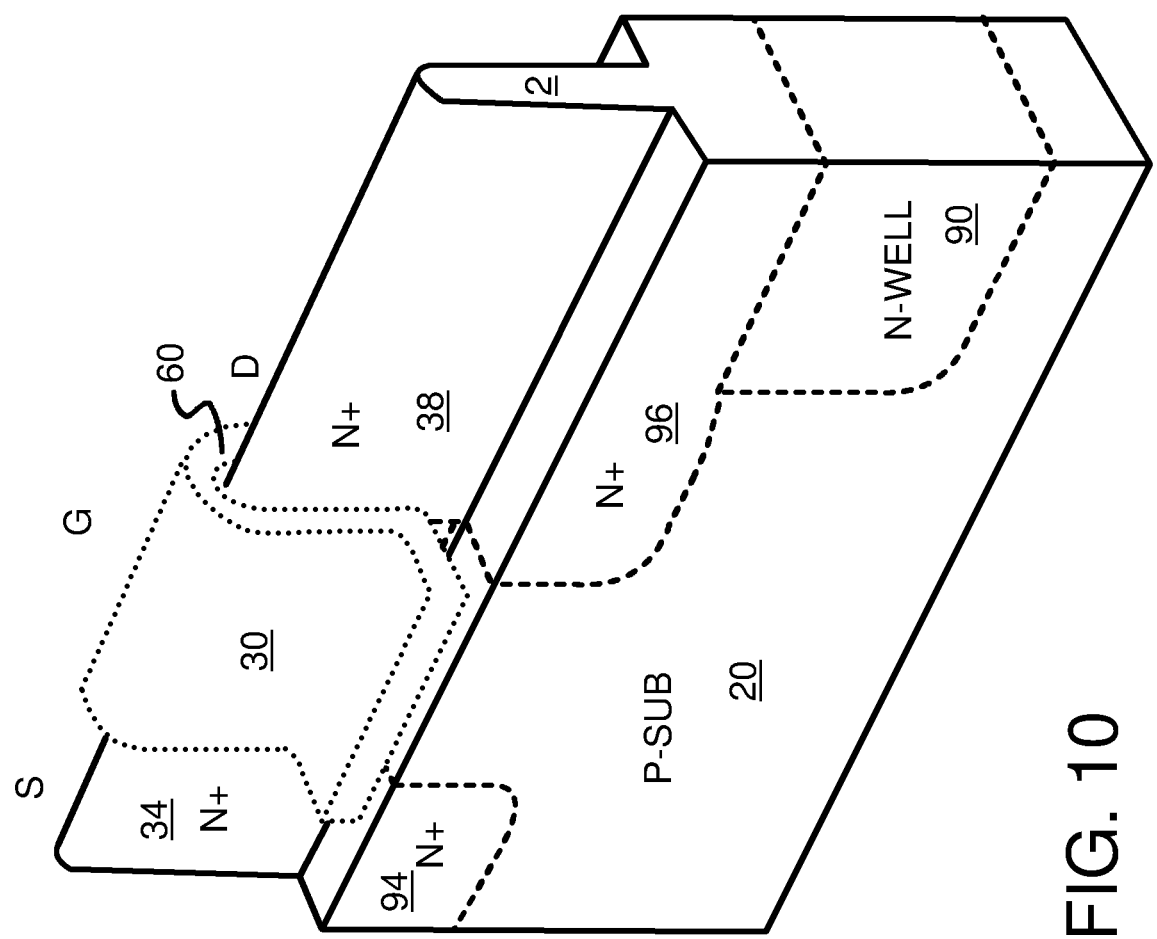
FIG. 10 shows a FinFET transistor for triggering a SCR.

FIG. 10 shows a FinFET transistor for triggering a SCR. Fin 2 may be formed on p-substrate 20 by epitaxial growth, etching of a thicker p-substrate 20, deposition, or any combination of methods. The substrate may be a silicon substrate or may be an insulator for Silicon-On-Insulator (SOI) processes. Gate oxide 60 under gate 30 may be an oxide such as hafnium oxide (Hf $O_2$), and may be a composite of several layers, such as a layer of Hf $O_2$ formed over a layer of silicon dioxide $SiO_2$, or various other advanced gate oxides. The exact cross-sectional profiles may vary from the idealized and simplified cross-sections shown in the drawings.

Fin 2 is made of silicon with a relatively light p-type doping. Then gate 30 is formed over a middle portion of the fin, with gate oxide 60 having been formed between gate 30 and the fin. Gate 30 is wrapped around fin 2.

Once gate 30 is formed, ion implantation may be used to implant n-type dopant ions into fin 2 to form N+ regions for the N+ source 34 and connecting N+ drain 38 adjacent to gate 30. When the energy of the ion implantation is sufficiently high, implanted ions may reach p-substrate 20 to form N+ regions 94, 96 in p-substrate 20 as well as N+ source 34 and connecting N+ drain 38 in fin 2. Alternately, lower-energy ions may be implanted into fin 2 and then diffused into p-substrate 20 to form N+ regions in both fin 2 and p-substrate 20. This deeper-than-normal N+ implant can improve hybrid device characteristics.

N-Well 90 formed in p-substrate 20 can contact connecting N+ drain 38 through N+ region 96 or directly. N+ regions 94, 96 can extend above and below the plane of FIG. 10 to connect together N+ regions in adjacent parallel fins.

Figure 11:
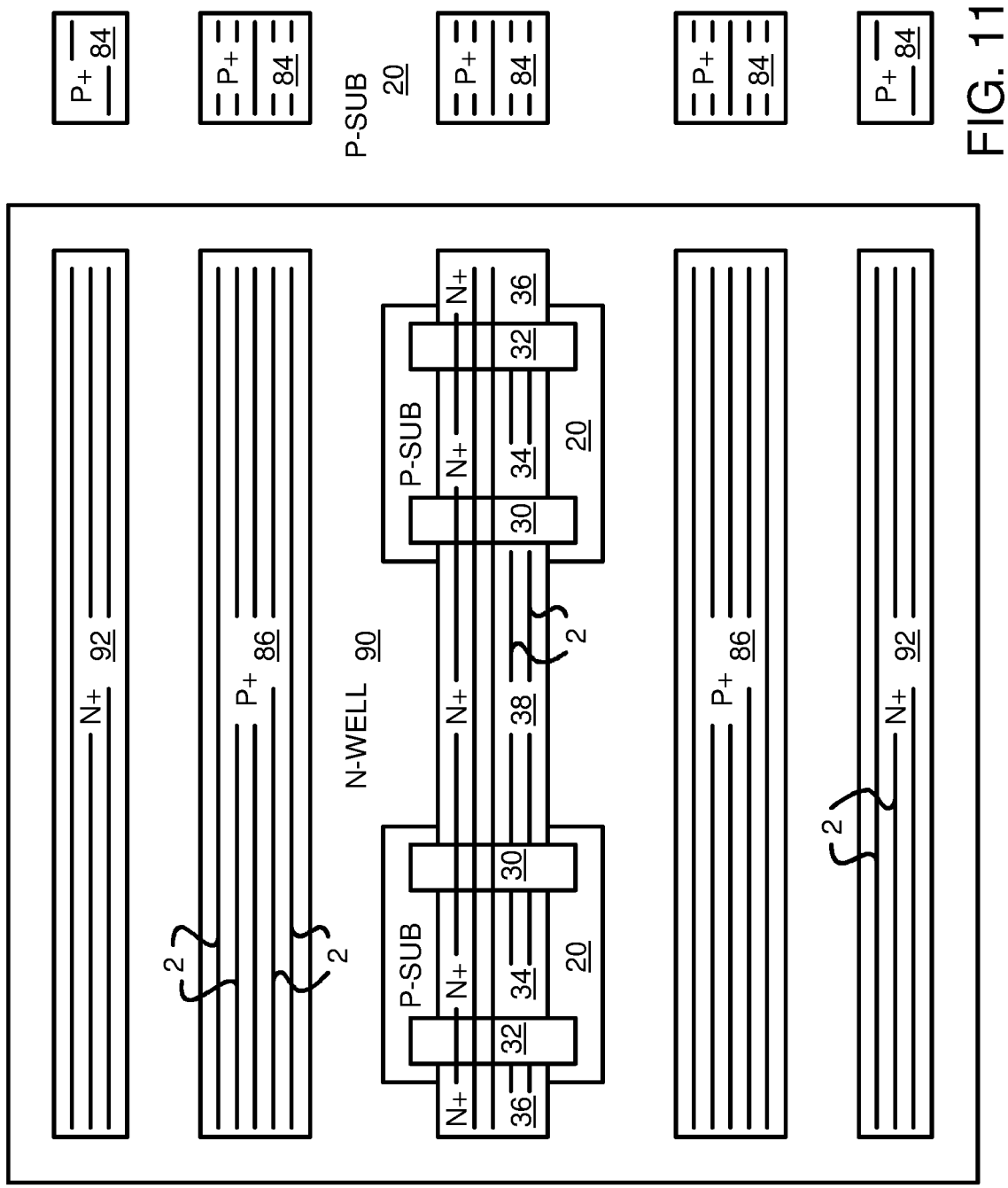
FIG. 11 shows a FinFET-process ESD SCR structure with perpendicular trigger and discharge paths.

FIG. 11 shows a FinFET-process ESD SCR structure with perpendicular trigger and discharge paths. P+ emitter 86 is formed by several fins 2 in parallel, each having P+ implanted into the fins. Similarly, N+ tap 92 is formed by many fins 2 in parallel that are N+ implanted. Each of P+ taps 84 is formed by several fins 2 in parallel, where P+ is implanted into these fins 2. The parallel fins 2 in N+ tap 92 are electrically connected together by diffusing N+ regions 96 into N-Well 90 under fins 2. Likewise, all fins 2 in P+ emitter 86 are connected together by P+ diffusions under fins 2 that spread out from fins 2 to form a larger P+ region under all fins 2 in P+ emitter 86. Other adjacent and parallel fins 2 in other regions are likewise connected together by side-diffusion under and outward from the fins, or by metal lines and contacts or vias.

Gates 30, 32 can be polysilicon lines that cross over several parallel fins 2, forming MOS transistors between N+ sources 34 and N+ drains 36, 38 in each of the parallel fins 2. Connecting N+ drain 38 has several parallel fins 2 that each connect to both gates 30. Openings in N-Well 90 form islands of p-substrate 20 that surround and are underneath the transistors formed where gates 30, 32 intersect between N+ sources 34 and N+ drains 36, 38.

The current flow through these triggering transistors formed by gates 30, 32 is in a horizontal direction, along each of the parallel fin 2 crossed by gates 30. This triggering current flow is along or parallel to horizontal cross-section 110.

A PNPN SCR structure is formed by fins 2 in P+ emitter 86, N-Well 90, p-substrate 20, and N+ sources 34. This is a vertical structure since current flows in a predominantly vertical direction along or parallel to vertical cross-section 120. This discharge current flows predominantly in the substrate and not along the long direction of fins 2. Discharge current flows through fins 2 to metal contacts (not shown) on the fins and does not have to travel lengthwise along the fins when contacts are spaced close together.

A large discharge current can flow in the vertical direction parallel to vertical cross-section 120, and perpendicular to fins 2, since the diffusion areas in the substrate are large. A smaller triggering current flows horizontally along the long dimension of fins 2, parallel to horizontal cross-section 110 through the transistors. Having several fins 2 in parallel increases the available triggering current through the channels in fins 2 under gates 30.

Figure 12:
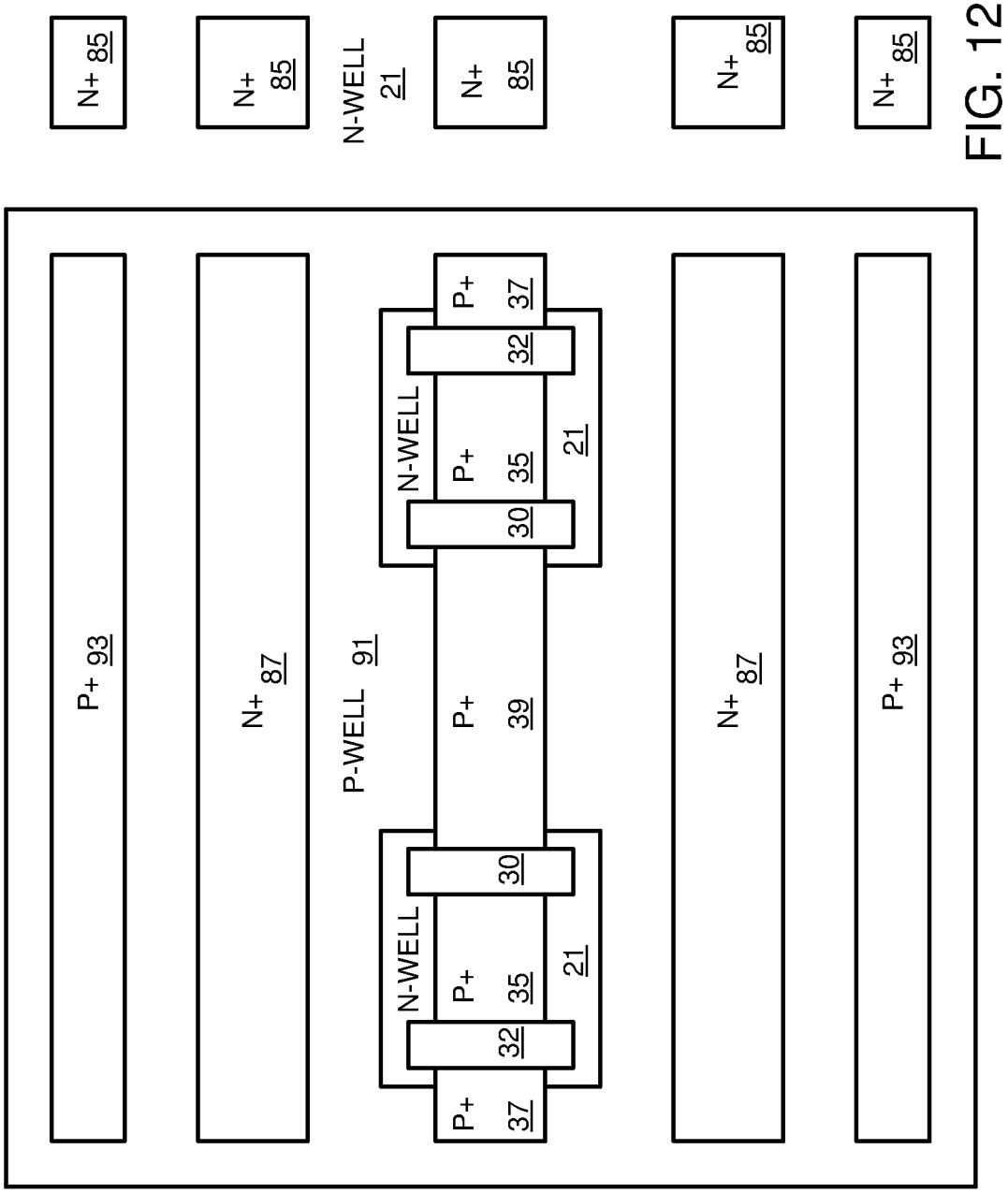
FIG. 12 is an alternative SCR for a dual-well process.

FIG. 12 is an alternative SCR for a dual-well process. P and N diffusions and regions are reversed. N+ taps 85 connect to N-Well 21 that form p-channel transistors where gates 30, 32 cross adjacent to P+ sources 35, end P+ drains 37, and connecting P+ drain 39. N+ emitter 87 and P+ tap 93 are formed over P-Well 91.

Figure 13:
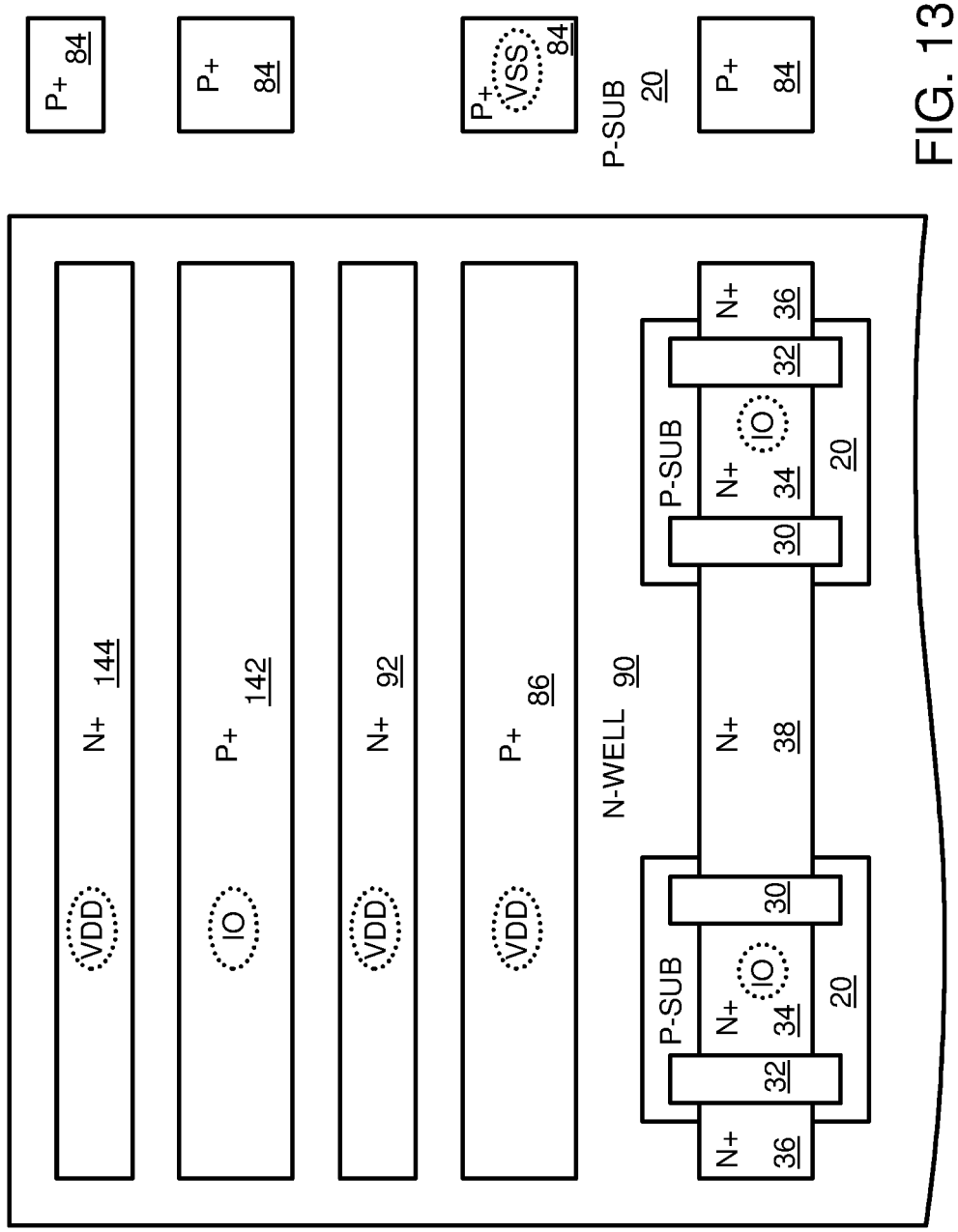
FIG. 13 shows the SCR device with a diode in parallel for bidirectional ESD protection.

FIG. 13 shows the SCR device with a diode in parallel for bidirectional ESD protection. Protection for an opposite-direction ESD pulse may be provided by a diode placed in parallel with the SCR. A p-diode may be connected between the IO pad and VDD. P+ diode region 142 and N+ diode region 144 are formed outside P+ emitter 86 and N+ tap 92. P+ diode region 142 is connected to the IO pad, while N+ diode region 144 is connected to VDD. The remaining SCR structure is as described earlier for FIGS. 3-4. While the p-diode conducts from the IO pad to VDD, the SCR conducts from VDD to the IO pad.

Figure 14:
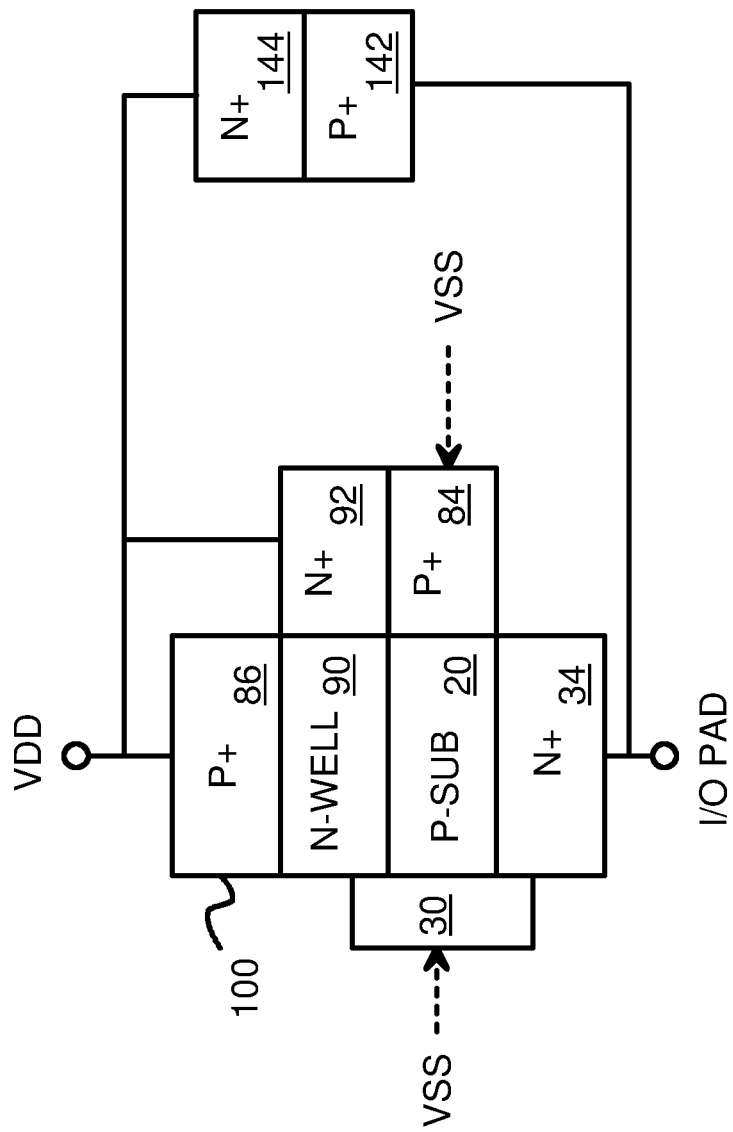
FIG. 14 is an electrical diagram of the SCR with the p-diode of Fig.

FIG. 14 is an electrical diagram of the SCR with the p-diode of FIG. 13. P+ diode region 142 connects to the IO pad and N+ diode region 144 connects to VDD. When a positive ESD pulse causes the IO pad to rise above VDD, the p-diode turns on, conducting from the IO pad to VDD.

A negative ESD pulse that goes below VSS turns on the triggering device of gate 30, injecting carriers into N-Well 90. The voltage gradient formed across N-Well 90 turns on the pn junction between P+ emitter 86 and N-Well 90, turning on the PNP device of the SCR. This current becomes self-sustaining as the NPN device also turns on. SCR discharge current flows from VDD to the IO pad.

Figure 15:
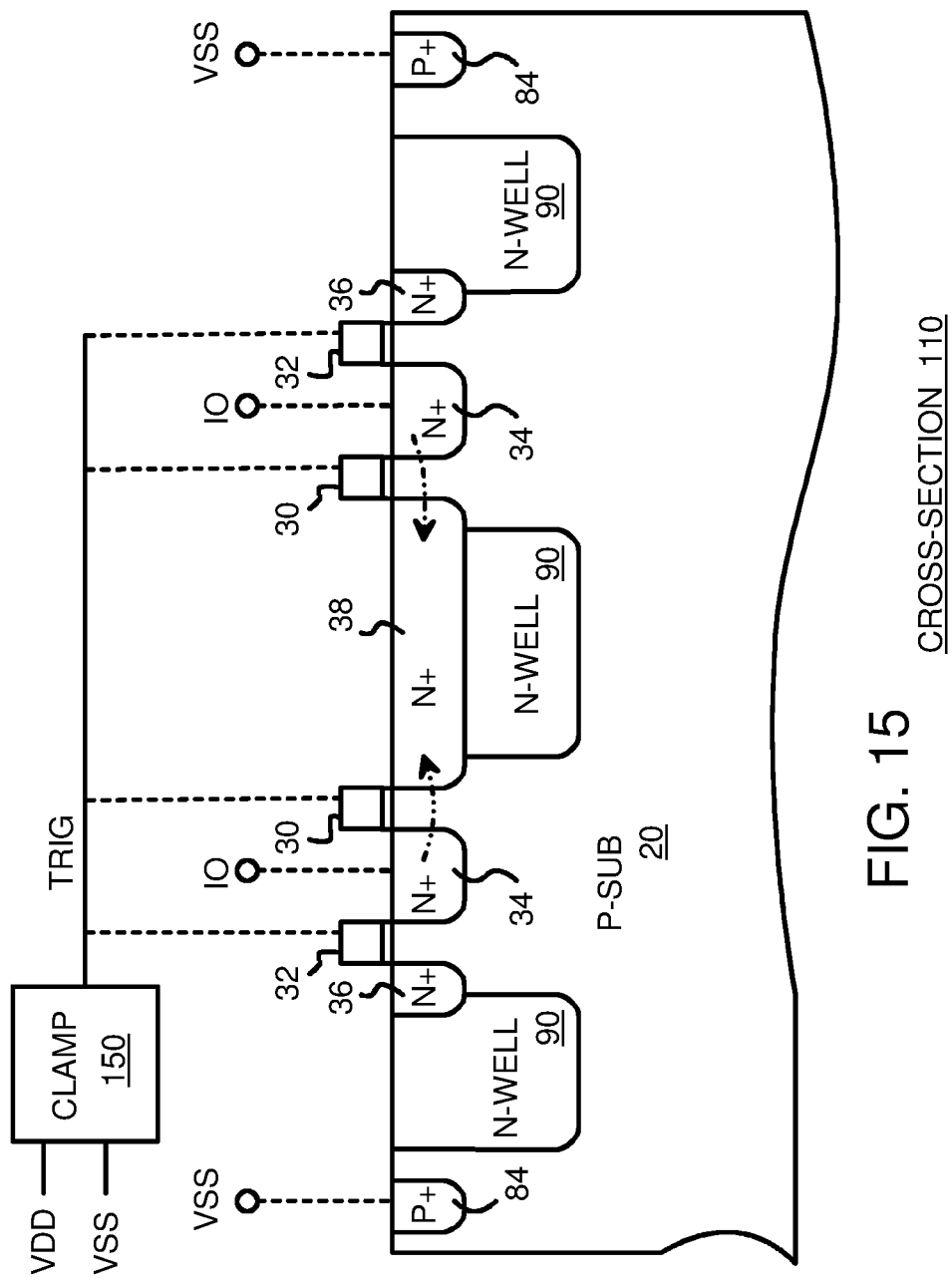
FIG. 15 shows a gate trigger for the SCR.

FIG. 15 shows a gate trigger for the SCR. Clamp 150 detects when VDD or another input falls below VSS, indicating a negative ESD event. Then clamp 150 drives trigger signal TRIG high, driving gates 30, 32 high to turn on their transistors. Trigger currents flow from the IO pad, through N+ sources 34, across the transistor gate to connecting N+ drain 38, and the trigger currents are injected into N-Well 90 to trigger the SCR discharge. The trigger transistors are turned on more rapidly and fully when TRIG is applied to gates 30, 32 rather than VSS, since TRIG is a higher voltage than VSS when an ESD event is detected by clamp 150. A variety of circuits can be used to implement clamp 150, such as a capacitor between TRIG and VDD, and a leaker transistor between TRIG and VSS. Clamp 150 may be a RC gate trigger, a diode chain, or a resistor detection circuit, as a few examples. Many alternative clamp circuits could be substituted.

ALTERNATE EMBODIMENTS

Several other embodiments are contemplated by the inventor. For example P+ taps 84 could be separate as shown in FIG. 3 or could be merged together into a strip or even a ring. P+ taps 84 could surround the SCR device on all 4 sides rather than only on the right side as shown in FIG. 3. The triggering devices could be arrayed or replicated, such as by repeating the structure of gates 30, 32 with N+ source 34 between each pair of gates 30, 32. Additional islands of p-substrate 20 could be arrayed to the left of FIG. 3, each island having one gate 30 and one gate 32 with one N+ source 34 in between that connects to the IO pad. The four gates 30, 32 of FIG. 3 could be arrayed or repeated to the left of FIG. 3, each pair of islands of p-substrate 20 having one connecting N+ drain 38 in between, and each pair with two end N+ drains 36, or end N+ drains 36 could be converted to connecting N+ drain 38 by connecting adjacent end N+ drains 36 to each other. Other regions such as P+ emitter 86 and N+ tap 92 could also be extended to the left for a larger (wider) SCR structure. The horizontal triggering structures of gates 30, 32 in the islands of p-substrate 20 with N+ regions 34, 36, 38 could also be arrayed in the y-direction, with another band of P+ emitter 86 between each pair of arrayed horizontal instances of gates 30, 32 in the islands of p-substrate 20. When the triggering devices and islands along horizontal cross-section 110 are arrayed twice in the vertical (y) direction, vertical cross-section 120 could have, from top to bottom, N-Well 90, N+ tap 92, N-Well 90, P+ emitter 86, N-Well 90, an island of p-substrate 20 with N+ source 34 in the middle of the island, N-Well 90, another P+ emitter 86, another island of p-substrate 20 with N+ source 34 in the middle of the island, N-Well 90, P+ emitter 86, N-Well 90, N+ tap 92, and N-Well 90.

The device could be simplified by deleting gates 32 and deleting end N+ drains 36. The device could be further simplified by having only one island of p-substrate 20, and only one gate 30. N+ source 34 would end within the island of p-substrate 20 and be connected to the IO pad, while connecting N+ drain 38 would extend across the island of p-substrate 20 and cross into N-Well 90 to form a well contact to inject charge.

There could be only 1 island of p-substrate 20, rather than 2 islands as shown in FIG. 3. Additional islands could be added. A gap could be placed in the middle of connecting N+ drain 38 rather than be continuous between 2 islands.

The number of FinFET fins in parallel within N+ sources 34 could be 5 or could be some other number, depending on the design rules and layout and trigger current desired. Some regions may have more fins and be wider than other regions. The spacing between regions could vary and depend on process design rules, and may be adjusted for desired discharge and trigger characteristics of the discharge and trigger devices. Different horizontal widths of diffusion regions such as N+ source 34 may be used. Different channel lengths of the gates may be used to adjust triggering voltage and DC leakage. An unbalanced number of fins between N+ sources 34 and N+ drains 36, 38 could be provided to increase robustness. Various parasitic capacitances may be present. The layout and geometry of the ESD device can affect its performance.

The exact boundary between P+ and N+ diffusions and N-Well 90 and p-substrate 20 regions in the substrate may extend either downward into the substrate or upward into the fins. The boundary does not have to be exactly at the fin-substrate boundary as shown in FIGS. 8-9. N+ or P+ regions on separate but parallel fins could be connected by lateral diffusions from N+ regions 94, 96 or similar P+ regions underneath the fins, or could be connected electrically by a dopant implant directly into the substrate between adjacent fins, especially when adjacent fins are spaced farther apart.

Terms such as up, down, above, under, horizontal, vertical, inside, outside, are relative and depend on the viewpoint and ae not meant to limit the invention to a particular perspective. Devices may be rotated so that vertical is horizontal and horizontal is vertical, so these terms are viewer dependent. As long as the two directions are substantially perpendicular to each other, one line or direction can be considered to be vertical and the other considered to be horizontal.

Gates 30, 32 have been shown as small rectangles, but can have various shapes, and may connect to each other either on the gate or polysilicon layer or through contacts to metal layers. Gates 30, 32 may connect to VSS through these contacts to metal that are not shown in the drawings. Gates 30, 32 could also be floating, or could be capacitively coupled to trigger or supply nodes. Gates 30, 32 could be standard polysilicon, or various other gate materials. The oxide underneath gates 30, 32 can be a gate oxide, or can be a thicker field or isolation oxide, or can be combinations of both, such as a thick oxide near the well boundary, but a thin gate oxide near the P+, N+ regions or fins. The gate oxide can be replaced by a shallow trench isolation or oxide to allow a deeper discharge path. Gates could be added that extend across the well boundary between p-substrate 20 and N-Well 90.

Various materials may be used. Substrate 20 may be silicon, or may be silicon-germanium, or other compounds such as Ga—As and may have various dopants added. Likewise, N+ fins and P+ fins may be made from the same material as p-type substrate 20, or may be a different material such as SiGe, and may have different dopants in different concentrations or profiles. Although the dopant concentration tends to vary within a region, the dopant concentration may still be considered to be relatively constant when compared with the rapid change in dopant concentration near region boundaries.

The substrate, p-substrate 20, is substantially planar although there may be variations of its upper surface due to features being etched into the top surface. The fin structure is substantially perpendicular to the planar surface of the substrate. The fin's sidewalls can be sloped somewhat, perhaps being within 20 degrees of perpendicular to the substrate's generally planar surface. The centerline between the two sidewalls can be nearly perpendicular, with no more than 20 degrees from being perpendicular to the plane of the substrate.

The semiconductor process used to manufacture the FinFET may have several variations. The VDD power supply voltage may be 1.8 volt or some other value. The alternatives may be combined in various ways, or used separately or in other combinations.

While N-Well 90 in p-type substrate 20 has been described, a deep P-well in an n-type substrate could be substituted, or a dual-well or multi-well process. Various alternate transistor technologies such as Bipolar or BiCMOS could be added.

While descriptions of current flows and operations have been presented, these are theoretical and the theories may be incomplete or even incorrect. Regardless of the physical mechanisms and theoretical interpretations, the structure does offer protection from ESD pulses. Especially for small devices, currents may flow in unusual ways and using mechanisms that have not yet been thoroughly researched and understood.

Currents may be considered to be perpendicular or orthogonal to each other even when they are not exactly 90 degrees from each other, such as when they are within 10% or 20% of 90%. The currents themselves may spread out or crowd together at various locations, and thus the current may not flow in a straight line, or part of a current may flow in a straight line, but edges of the current flow may bend or curve around obstacles such as diffusion region edges. Currents may flow in different planes but still be considered to be perpendicular or orthogonal. For example, currents flowing through the FinFET transistors flow within the fins above the substrate surface, while discharge currents flow within the substrate, below the fins, except for a small area where the discharge current flows up through P+ or N+ fins and for exiting through metal contacts to the IO pad, VDD, VSS, or some other node. Thus current flow directions are simplified and averaged and can ignore endpoint connections such as contacts to external metal lines, and fringe and boundary effects.

Cutouts in diffusion and other regions may be used. Other shapes and physical layouts may be substituted, such as intermingled fingers. The layout could have isolating N-wells merging with a floating N-well so that they are all one interconnected N-well. Wells or substrate regions could be merged together, such as by forming a ring or doughnut shape when the layout is viewed from above.

Devices may be implemented using n-channel, p-channel, or bipolar transistors, or junctions within these transistors. A capacitor could be attached to a resistance to provide an R-C time delay, or more complex circuits such as active triggering circuits may be added. In some embodiments, high-voltage transistors may be used rather than low-voltage transistors with appropriate bias conditions. The gate lengths can be increased to provide better protection from damage.

Different transistor, capacitor, resistor, and other device sizes can be used, and various layout arrangements can be used, such as multi-leg, ring, doughnut or irregular-shape transistors. Additional taps, guard rings, transistors, and other components may be added. The power node could be a common-discharge line (CDL) that normally floats rather than a power line. While a simple inverter of core transistors 22, 24 has been shown, more complex gates and interconnections may drive internal nodes, and there can be several internal nodes that connect to different input or output pads. The input/output pads may be connected to an input buffer, test-scan logic, and other circuits. More than one power supply may be used.

P and N wells could be reversed, and a NPNP ESD device used rather than a PNPN ESD device. A deep P-well could be used or a deep N-well. Some embodiments may use an additional deep N+ or P+ implant region, or the location and depth of implant regions may be shifted. The final profiles and shapes of various layers may differ depending on the process used. In particular, deeper layers may shift around relative to the mask layouts. Also, the mask edges and final processed boundaries may differ with process steps.

The shape of the ESD device may differ, such as by having a more rounded bottom or field-oxide boundaries. Guard rings may be continuous or have openings or cutouts for various reasons. Both a P+ and an N+ guard ring could be used. P+ and N+ guard rings may be electrically connected together and left floating or connected to a fixed voltage such as the power supply or ground, or may be connected to different voltages, such as connecting a P+ guard ring to ground and an N+ guard ring to the power supply. The voltage biases to guard rings may be actively switched, or muxed for various modes and conditions of operation.

Additional leaker devices such as resistors and small transistors could be added. Parasitic capacitances and resistances may be used from some components, depending on the process and device sizes used.

The ESD-protection circuit can be combined with other input-protection circuits, such as a power clamp circuit, other pad protection circuits, or a series-resistor protection circuit to the gate of an input buffer. Grounded-gate and thick oxide protection transistors and diodes can also be added at various points to increase ESD protection. One, two, or four of the ESD structures could be added to each I/O pin, or just to input pins.

Both thick oxide and thin oxide transistors may be protected by the power clamp and ESD protection devices. Alternately, several power clamps with different combinations of transistors and power-supply voltages may be used. Each pad may have only one ESD protection device, only two ESD protection devices, or four ESD protection devices as shown in FIG. 1. The anode and cathode (A and K) nodes may be reversed to swap the direction of protection.

Bias, VDD, and voltage values may vary somewhat due to process, temperature, and design variances. Snap-back or punch-through voltages may vary with process, temperature, and exact geometries of the transistors. While descriptions of operation have been given based on a theoretical understanding of the physical processes, these theoretical descriptions may be incorrect. Second and third order effects may also be present. Various mechanisms may be responsible for breakdown and conduction under various conditions.

Large output driver transistors also act as large diodes for some ESD tests and conditions. For example, when the ESD pulse is applied across an I/O pad and the power-supply pad, a positive ESD pulse can turn on a parasitic p-n drain-substrate junction of the drain of the large p-channel driver transistor. The n-type substrate or well of the p-channel driver transistor is normally connected to the I/O power supply. Thus the p-n junction is forward biased by the positive ESD pulse. While output pads have been described, other connection technologies may be substituted, such as ball-grid-array (BGA), flip-chip, etc., and the term pads is considered to apply to all such balls, pads, landings, etc. that are for external connection.

Likewise, when the ESD pulse is applied across the I/O pad and the ground pad, a negative ESD pulse can turn on the parasitic n-p drain-substrate junction of the drain of the large n-channel driver transistor. The p-type substrate or well of the n-channel driver transistor is normally connected to the I/O ground. Thus the p-n junction is forward biased by the negative ESD pulse. Various cross-domain coupling paths and mechanisms may exist that couple ESD pulses applied to one power-supply domain to another power-supply domain.

The background of the invention section may contain background information about the problem or environment of the invention rather than describe prior art by others. Thus inclusion of material in the background section is not an admission of prior art by the Applicant.

Any methods or processes described herein are machine-implemented or computer-implemented and are intended to be performed by machine, computer, or other device and are not intended to be performed solely by humans without such machine assistance. Tangible results generated may include reports or other machine-generated displays on display devices such as computer monitors, projection devices, audio-generating devices, and related media devices, and may include hardcopy printouts that are also machine-generated. Computer control of other machines is another tangible result.

Any advantages and benefits described may not apply to all embodiments of the invention. When the word "means" is recited in a claim element, Applicant intends for the claim element to fall under 35 USC Sect. 112, paragraph 6. Often a label of one or more words precedes the word "means". The word or words preceding the word "means" is a label intended to ease referencing of claim elements and is not intended to convey a structural limitation. Such means-plus-function claims are intended to cover not only the structures described herein for performing the function and their structural equivalents, but also equivalent structures. For example, although a nail and a screw have different structures, they are equivalent structures since they both perform the function of fastening. Claims that do not use the word "means" are not intended to fall under 35 USC Sect. 112, paragraph 6. Signals are typically electronic signals, but may be optical signals such as can be carried over a fiber optic line.

The foregoing description of the embodiments of the invention has been presented for the purposes of illustration and description. It is not intended to be exhaustive or to limit the invention to the precise form disclosed. Many modifications and variations are possible in light of the above teaching. It is intended that the scope of the invention be limited not by this detailed description, but rather by the claims appended hereto.

I claim:

1. A triggered Silicon-Controlled Rectifier (SCR) Electro-Static-Discharge (ESD) protection structure comprising:
   a trigger transistor having a gate for controlling a trigger current that flows between a source and a connecting drain, wherein the gate, the source, and a first portion of the connecting drain are formed over a substrate of a first polarity type, wherein the source and the connecting drain are of a second polarity type;
   wherein the connecting drain extends across a well boundary, the connecting drain having the first portion over the substrate of the first polarity type and having a second portion over a well having the second polarity type;
   a first SCR region having the first polarity type, formed in the well;
   a first terminal connected to the first SCR region; and
   a second terminal connected to the source;
   wherein the first SCR region provides a discharge current from the first terminal, the discharge current flowing from the first SCR region, across the well, to the substrate under the source, and to the source to the second terminal;
   wherein the discharge current flows in a first direction;
   wherein the trigger current flows in a second direction under the gate from the source to the connecting drain;
   wherein the first direction is orthogonal to the second direction;
   whereby the trigger current and the discharge current are orthogonal.

2. The triggered SCR ESD protection structure of claim 1 further comprising:
   a first tap having the first polarity type, the first tap formed in the substrate, the first tap for biasing the substrate by connecting to a second supply;
   a second tap having the second polarity type, the second tap formed in the well, the second tap for biasing the well by connecting to a first supply.

3. The triggered SCR ESD protection structure of claim 2 wherein the first SCR region is substantially parallel to a line containing the trigger transistor, the source, and the connecting drain; wherein the first SCR region is separated from the trigger transistor, the source, and the connecting drain by the well.

4. The triggered SCR ESD protection structure of claim 3 wherein the first SCR region is placed between the second tap and the trigger transistor.

5. The triggered SCR ESD protection structure of claim 2 wherein the gate and the source and the first portion of the connecting drain are formed within an island of the substrate of the first polarity type;
   wherein the island is surrounded by the well of the second polarity type.

6. The triggered SCR ESD protection structure of claim 5 further comprising:
   a plurality of the island, each island having the gate, the source, and the first portion of the connecting drain;
   wherein the plurality of the island is arrayed in the second direction;
   wherein the connecting drain for adjacent islands are connected together to have a first portion in a first island and a second first portion in a second island and a second portion between the first portion and the second first portion.

7. The triggered SCR ESD protection structure of claim 2 further comprising:
   a second gate located between the source and an end drain having the second polarity type;
   wherein the end drain extends across the well boundary, the end drain having a first portion over the substrate of the first polarity type and having a second portion over the well having the second polarity type;
   wherein the end drain, the source, and the connecting drain are all located on a line that is parallel to the second direction.

8. The triggered SCR ESD protection structure of claim 2 wherein the source and connecting drain are formed in a fin above a surface of the substrate, wherein a long dimension of the fin is parallel to the second direction;
   wherein the trigger current flows in the fin in the second direction;
   wherein the gate is formed over the fin on a top and on two sides of the fin, the gate formed between the source and the connecting drain;
   wherein the gate, the source, and the first portion of the connecting drain form a Fin Field-Effect Transistor (FinFET) transistor.

9. The triggered SCR ESD protection structure of claim 8 wherein a plurality of fins are formed in parallel along the second direction, each fin having a FinFET transistor carrying a portion of the trigger current in the second direction;
   wherein the source for adjacent fins are connected together by a lateral diffusion of the second polarity type in the substrate between adjacent fins;
   wherein the gate over adjacent fins are connected together;
   wherein the connecting drain for adjacent fins are connected together by a lateral diffusion of the second polarity type in the substrate between the adjacent fins.

10. The triggered SCR ESD protection structure of claim 9 wherein the first SCR region further comprises a plurality of fins formed above a surface of the well, wherein the plurality of fins comprises fins that are parallel to each other, each fin having a long dimension that is formed parallel to the second direction.

11. The triggered SCR ESD protection structure of claim 2 wherein the first polarity type is p-type and the second polarity type is n-type.

12. The triggered SCR ESD protection structure of claim 11 wherein the gate is connected to a trigger signal generator that activates the gate to conduct the trigger current when an Electro-Static-Discharge (ESD) is detected.

13. The triggered SCR ESD protection structure of claim 2 further comprising:
   a first diode region of the first polarity type, connected to the second terminal;
   a second diode region of the second polarity type, connected to the first terminal;
   wherein the second tap is located between the first SCR region and the first diode region;
   wherein the first diode region is located between the second tap and the second diode region.

14. An electrical protection device comprising:
   a substrate of a first polarity type;
   a well of a second polarity type formed in the substrate;
   wherein the first polarity type is opposite to the second polarity type;
   an island of the substrate that is surrounded by the well;
   a first emitter region of the first polarity type, the first emitter region formed in the well as a continuous band that is wider than the island and extends beyond the island on both sides, the first emitter region being spaced apart from the island;
   a gate formed in the island, the gate for controlling a trigger current that flows in a channel underneath the gate;
   a diffusion band that is parallel to the continuous band of the first emitter region, the diffusion band intersecting the gate to form the channel underneath the gate;
   a source region on a first end of the diffusion band, the source region being completely within the island and having the gate at one end;
   a drain region on the diffusion band on an opposite end of the gate where the gate crosses the diffusion band, the drain region being within the island;
   an extension of the diffusion band, connected to the drain region and extending beyond the island to connect with the well;
   wherein the diffusion band is doped with dopant of the second polarity type except for the channel under the gate;
   a well tap of the second polarity type, formed in the well and farther from the island than the first emitter region;
   a substrate tap of the first polarity type, the substrate tap formed outside the well and outside the island;
   wherein an x cross-sectional plane that is orthogonal to a plane of the substrate intersects the plane of the substrate in a line having an x-direction;
   wherein the x cross-sectional plane passes through the island, the source region in the island, the gate in the island, the channel underneath the gate, the drain region in the island, and the extension of the diffusion band;
   wherein a y cross-sectional plane that is orthogonal to the plane of the substrate and is orthogonal to the x cross-sectional plane intersects the plane of the substrate in a line having a y-direction that is orthogonal to the x-direction;
   wherein the y cross-sectional plane passes through the island, the source region in the island, the well, and the first emitter region;
   a first terminal for electrical connection to the first emitter region; and
   a second terminal for electrical connection to the source region;
   wherein a trigger voltage applied across the first terminal and the second terminal causes the gate to turn on and conduct a trigger current from the source region through the channel to the drain region and to the extension of the diffusion band;
wherein the trigger current flows in the x-direction;
wherein the trigger current injects charge from the extension of the diffusion band into the well, causing a voltage gradient that turns on the first emitter region to conduct a discharge current;
wherein the discharge current flows from the first emitter region, through the well to the island of the substrate, and to the source region in the island;
wherein the discharge current flows in the y-direction that is perpendicular to the trigger current flowing in the x-direction.

15. The electrical protection device of claim 14 further comprising:
a second island formed within the well;
a second gate formed within the second island;
wherein the diffusion band extends to the second island and forms a second channel underneath the second gate;
a second source region formed in the diffusion band beyond the second gate and within the second island;
wherein the first emitter region is formed in the well as a continuous band that extends beyond the island and extends beyond the second island, the first emitter region being spaced apart from the island and from the second island;
a second emitter region of the first polarity type, the second emitter region formed in the well as a second continuous band that that extends beyond the island and extends beyond the second island, the second emitter region being spaced apart from the island and from the second island;
wherein the first emitter region and the second emitter region are on opposite sides of the diffusion band that intersects the island and the second island.

16. The electrical protection device of claim 15 further comprising:
a third gate formed in the island, the third gate having a third channel where the third gate crosses the diffusion band;
a third drain formed in the diffusion band next to the third gate and opposite the source region, the third drain region extending to an end of the island to make electrical contact with the well;
wherein a third trigger current flows from the source region, through the third channel to the third drain region, the third trigger current flowing in an opposite direction to the trigger current, the third trigger current flowing in a negative x-direction;
a fourth gate formed in the second island, the fourth gate having a fourth channel where the fourth gate crosses the diffusion band;
a fourth drain formed in the diffusion band next to the fourth gate and opposite the source region, the fourth drain extending to an end of the second island to make electrical contact with the well.

17. The electrical protection device of claim 16 wherein the diffusion band further comprises a plurality of fins extending above a surface of the substrate and above a surface of the well, the plurality of fins being parallel to one another and in the x-direction;
wherein the gate is formed over the plurality of fins, wherein the channel is within the fin underneath the gate;
wherein the source region and the drain region are formed in the fin over the island, and the extension of the drain region is formed in the fin over the well.

18. The electrical protection device of claim 17 wherein the first polarity type is an n-type and the second polarity type is a p-type, wherein the gate, channel, source region, and drain region form a p-channel Fin Field-Effect Transistor (FinFET).

19. A Fin Field-Effect Transistor (FinFET) Electro-Static-Discharge (ESD) protection device comprising:
a substrate of a first polarity type;
a well of a second polarity type formed within the substrate;
an island hole within the well, the island hole being a portion of the substrate surrounded by the well;
a plurality of fins formed above the substrate, each fin in the plurality of fins having a longest dimension in an x-direction, wherein the plurality of fins are formed along portions of imaginary lines parallel to one another;
a gate formed over a fin in the plurality of fins;
a first fin in the plurality of fins, the first fin having the second polarity type for all portions of the fin not covered by the gate, and having the first polarity type for portions of the fin covered by the gate;
a source region of the first fin, the source region formed over the island hole, the source region being adjacent to the gate;
a drain region in the first fin, the drain region formed over the island hole, the drain region being adjacent to the gate on an opposite side of the gate from the source region;
an extension region of the first fin, extending from the drain region and extending past the island hole and over the well, the extension region for injecting carriers into the well from a trigger current that flows from the source region, underneath the gate and through the drain region and into the extension region;
wherein the trigger current flows in the x-direction; and
a first emitter fin in the plurality of fins, the first emitter fin being formed over the well and having a length that is longer than the first fin, the first emitter fin being parallel to the first fin, the first emitter fin having the first polarity type;
wherein when the trigger current injects carriers into the well, a discharge current is initiated, the discharge current flowing in a y-direction from the first emitter fin, through the well and into the substrate in the island hole, and into the source region of the first fin;
wherein the first emitter fin is electrically connected to a first terminal;
wherein the source region of the first fin is electrically connected to a second terminal;
wherein when an electrical shock is applied between the first terminal and the second terminal, the trigger current flows in the x-direction to trigger the discharge current to flow in the y-direction.

20. The FinFET ESD protection device of claim 19 further comprising:
a second island hole within the well, the second island hole being a portion of the substrate surrounded by the well;
wherein the first fin has the second polarity type for all portions of the fin not covered by the gate or by a second gate, the first fin having the first polarity type for portions of the fin covered by the gate or covered by the second gate;

wherein the first fin further comprises:
a second source region of the first fin, the second source region formed over the second island hole, the second source region being adjacent to the second gate;
a second drain region in the first fin, the second drain region formed over the second island hole, the second drain region being adjacent to the second gate on an opposite side of the second gate from the second source region;
a second extension region of the first fin, extending from the second drain region and extending past the second island hole and over the well, the extension region for injecting carriers into the well from a second trigger current that flows in a negative x-direction from the second source region, underneath the second gate and through the second drain region and into the extension region;
wherein the extension region and the second extension region are adjacent to each other and contact each other over the well between the island hole and the second island hole.

\* \* \* \* \*